US010825957B1

(12) United States Patent
Zheng et al.

(10) Patent No.: US 10,825,957 B1
(45) Date of Patent: Nov. 3, 2020

(54) LIGHT-EMITTING DIODE

(71) Applicant: XIAMEN SANAN OPTOELECTRONICS TECHNOLOGY CO., LTD., Xiamen (CN)

(72) Inventors: Gaolin Zheng, Xiamen (CN); Hou-Jun Wu, Xiamen (CN); Anhe He, Xiamen (CN); Shiwei Liu, Xiamen (CN); Kang-Wei Peng, Xiamen (CN); Su-Hui Lin, Xiamen (CN); Chia-Hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 16/887,877

(22) Filed: May 29, 2020

Related U.S. Application Data

(63) Continuation of application No. 16/147,763, filed on Sep. 30, 2018, now Pat. No. 10,707,380.

(30) Foreign Application Priority Data

Oct. 24, 2017 (CN) .................. 2017 2 1377414 U
Oct. 24, 2017 (CN) .................. 2017 2 1379090 U

(51) Int. Cl.
*H01L 33/38* (2010.01)
*H01L 33/46* (2010.01)

(52) U.S. Cl.
CPC .......... *H01L 33/387* (2013.01); *H01L 33/382* (2013.01); *H01L 33/38* (2013.01); *H01L 33/46* (2013.01)

(58) Field of Classification Search
CPC ..... H01L 33/38; H01L 33/382; H01L 33/387; H01L 33/46
USPC ............................................. 257/99
See application file for complete search history.

(56) References Cited

U.S. PATENT DOCUMENTS

| 4,243,996 A * | 1/1981 | Lebailly | H01L 33/0025 257/96 |
| 6,711,192 B1 * | 3/2004 | Chikuma | H01S 5/22 372/43.01 |
| 2013/0234192 A1 * | 9/2013 | Kim | H01L 33/385 257/98 |

(Continued)

*Primary Examiner* — Long K Tran
(74) *Attorney, Agent, or Firm* — Syncoda LLC; Feng Ma

(57) ABSTRACT

A light-emitting diode includes: a semiconductor epitaxial structure including a first semiconductor layer, a second semiconductor layer disposed over the first semiconductor layer, an active layer between the first and second semiconductor layers; a first electrode electrically coupled to the first semiconductor layer and including a plurality of first sub-electrodes, wherein the plurality of first sub-electrodes are divided into one or more groups, and any two adjacent first sub-electrodes in the same group have a same projection distance; a second electrode disposed over and electrically coupled to the second semiconductor layer; a third electrode coupled to the plurality of first sub-electrodes and including one or more third sub-electrodes, wherein one of the third sub-electrodes corresponds to one of said one or more groups of the first sub-electrodes and connects first sub-electrodes in the group; and a fourth electrode coupled to the second electrode.

20 Claims, 13 Drawing Sheets

(56) References Cited

U.S. PATENT DOCUMENTS

2016/0118564 A1* 4/2016 Kim .................... H01L 33/382
                                                                         257/99

* cited by examiner

LIGHT-EMITTING DIODE

CROSS-REFERENCE TO RELATED APPLICATIONS

This application is a continuation of U.S. patent application Ser. No. 16/147,763 filed on Sep. 30, 2018, which claims priority to Chinese Patent Application No. 201721377414.1 filed on Oct. 24, 2017, and No. 201721379090.5 filed on Oct. 24, 2017. The disclosures of these applications are hereby incorporated by reference in their entirety.

BACKGROUND

A light-emitting diode ("LED" for short) features long service life and low energy consumption, being widely applied in different fields. Typically III-V compound semiconductors represented by GaN have great application potential in high-luminance light-emitting diode, laser and other photoelectronic devices due to wide band gap, high light emitting efficiency, high drift velocity of saturated electrons and stable chemical properties, having attracted extensive attention.

FIG. 1 shows a structural diagram of an existing light-emitting diode. Light emitting elements of the light-emitting diode include: a substrate 100, a buffer layer 200 formed on substrate 100, a n-type semiconductor layer 300 formed on buffer layer 200, an active layer 400 formed on n-type semiconductor layer 300, an p-type semiconductor layer 500 formed on active layer 400, an transparent conductive membrane 600 formed on p-type semiconductor layer 500 to realize current diffusion, a p-side bond pad 700 formed on transparent conductive membrane 600, a n-side bond pad 800 exposed due to etching and formed on n-type semiconductor 300, as well as a distributed Bragg reflector (DBR) 900 and a reflective metal coating 904 on the transparent conductive membrane 600. This structure may reduce light absorption by the reflective metal coating (904), but has relatively poor performance of current dispersion compared with the case when electrodes 901, 902 and 903.

SUMMARY

Various embodiments of the present disclosure provide a light-emitting diode, including: a semiconductor epitaxial structure including a first semiconductor layer, a second semiconductor layer disposed over the first semiconductor layer, an active layer disposed between the first and second semiconductor layers; a first electrode electrically coupled to the first semiconductor layer; and a second electrode disposed over and electrically coupled to said second semiconductor layer; wherein: the first electrode includes a plurality of first sub-electrodes; the second electrode includes a plurality of second sub-electrodes; and any two adjacent first sub-electrodes and/or second sub-electrodes have a same projection distance.

In some embodiments, the first electrode and/or second electrode include(s) six sub-electrodes forming a minimal unit of closely-packed hexagonal structure; the six sub-electrodes are composed of one or more of the first sub-electrodes, the second sub-electrodes, or a combination of the first sub-electrodes and the second sub-electrodes.

In some embodiments, the closely-packed hexagonal structure includes one first sub-electrode or one second sub-electrode as a center.

In some embodiments, the closely-packed hexagonal structure includes six first sub-electrodes, or six second sub-electrodes, or two first sub-electrodes and four second sub-electrodes, or four first sub-electrodes and two second sub-electrodes.

In some embodiments, the closely-packed hexagonal structure includes three first sub-electrodes and three second sub-electrodes.

In some embodiments, the first sub-electrodes and second sub-electrodes are arranged in a staggered manner.

In some embodiments, the three first sub-electrodes constitute one minimal unit of equilateral triangle; and the three second sub-electrodes constitute one minimal unit of equilateral triangle.

In some embodiments, a number of said first sub-electrodes is smaller than or equal to a number of second sub-electrodes.

In some embodiments, a ratio of the first sub-electrodes to the second sub-electrodes ranges from 0.3-0.9.

In some embodiments, a distance between two adjacent first sub-electrodes is 10~150 μm; and a distance between two adjacent second sub-electrodes is 10~150 μm.

The present disclosure also provides a light-emitting diode, comprising: a semiconductor epitaxial structure including a first semiconductor layer, a second semiconductor layer disposed over the first semiconductor layer, an active layer between the first and second semiconductor layers; a first electrode electrically coupled to the first semiconductor layer and including a plurality of first sub-electrodes; a second electrode disposed over and electrically coupled to the second semiconductor layer, and including a plurality of second sub-electrodes; a third electrode coupled to the plurality of first sub-electrodes and including a plurality of third sub-electrodes; a fourth electrode coupled to the plurality of second sub-electrodes and including a plurality of fourth sub-electrodes; wherein any two adjacent first sub-electrodes and/or second sub-electrodes have a same projection distance In some embodiments, a ratio between the third sub-electrodes to the fourth sub-electrodes is greater than or equal to 2:1.

In some embodiments, the proportion of the third sub-electrodes to the fourth sub-electrodes is greater than 4:1.

In some embodiments, the third sub-electrodes have straight or curved strip pattern.

In some embodiments, the curved strip pattern includes S-shaped pattern or Z-shaped pattern.

In some embodiments, the several third sub-electrodes have the same shape or different shapes.

In some embodiments, adjacent third sub-electrodes have several second sub-electrodes placed in between.

In some embodiments, the several second sub-electrodes placed in between have the same or similar patterns with neighbouring third sub-electrodes.

In some embodiments, the fourth sub-electrodes have hollow pattern.

In some embodiments, a fifth electrode and a sixth electrode are also included, wherein the fifth electrode is connected to the several third sub-electrodes, and the sixth electrode is connected to the several fourth sub-electrodes.

In some embodiments, the fifth electrode and the sixth electrode have the same shape and are arranged symmetrically.

Various embodiments of the present disclosure can have one or more of the following advantageous effects.

(1) Through even and separate distribution of first sub-electrodes and second sub-electrodes in the structure of a light-emitting diode, any two adjacent first sub-electrodes and/or second sub-electrodes have the same projection distance; the first electrodes are separate and not interconnected; the first conductive type semiconductor layer has reduced platform etching area to increase the light emitting area; the second electrodes are separate and not interconnected, so that the interface between the light emitting area and the insulating layer (such as the DBR reflecting layer) is maximized and the luminance is enhanced.

(2) All sub-electrodes are distributed in an even array; any two adjacent first sub-electrodes and/or second sub-electrodes have the same projection distance, enabling the optimal distribution of current dispersion and reduction of the forward voltage fall (VF).

(3) The fourth sub-electrodes have hollow pattern; the third sub-electrodes lie at the hollow parts of the fourth sub-electrodes and have complementary pattern to the fourth sub-electrodes; through proper proportioning of the third sub-electrodes to the fourth sub-electrodes, the uniformity of current injection distribution can be effectively regulated, so as to enhance the light emitting uniformity and efficiency of the light-emitting diode.

The other features and advantages of this present disclosure will be described in detail in the following specification, and it is believed that such features and advantages will become more obvious in the specification or through implementations of this invention. The purposes and other advantages of the present disclosure can be realized and obtained in the structures specifically described in the specifications, claims and drawings.

While the invention will be described in conjunction with some embodiments and methods of use, it will be understood by those skilled in the art that such description is not intended to limit the scope of the present disclosure, and various alternations, modifications and equivalents may be made therein without departing from the spirit and scope of the invention as defined by the appended claims.

BRIEF DESCRIPTION OF THE DRAWINGS

The accompanying drawings, which are included to provide a further understanding of the embodiments and constitute a part of this specification, together with the embodiments, are therefore to be considered in all respects as illustrative and not restrictive. In addition, the drawings are merely illustrative, which are not drawn to scale.

Figure 1:
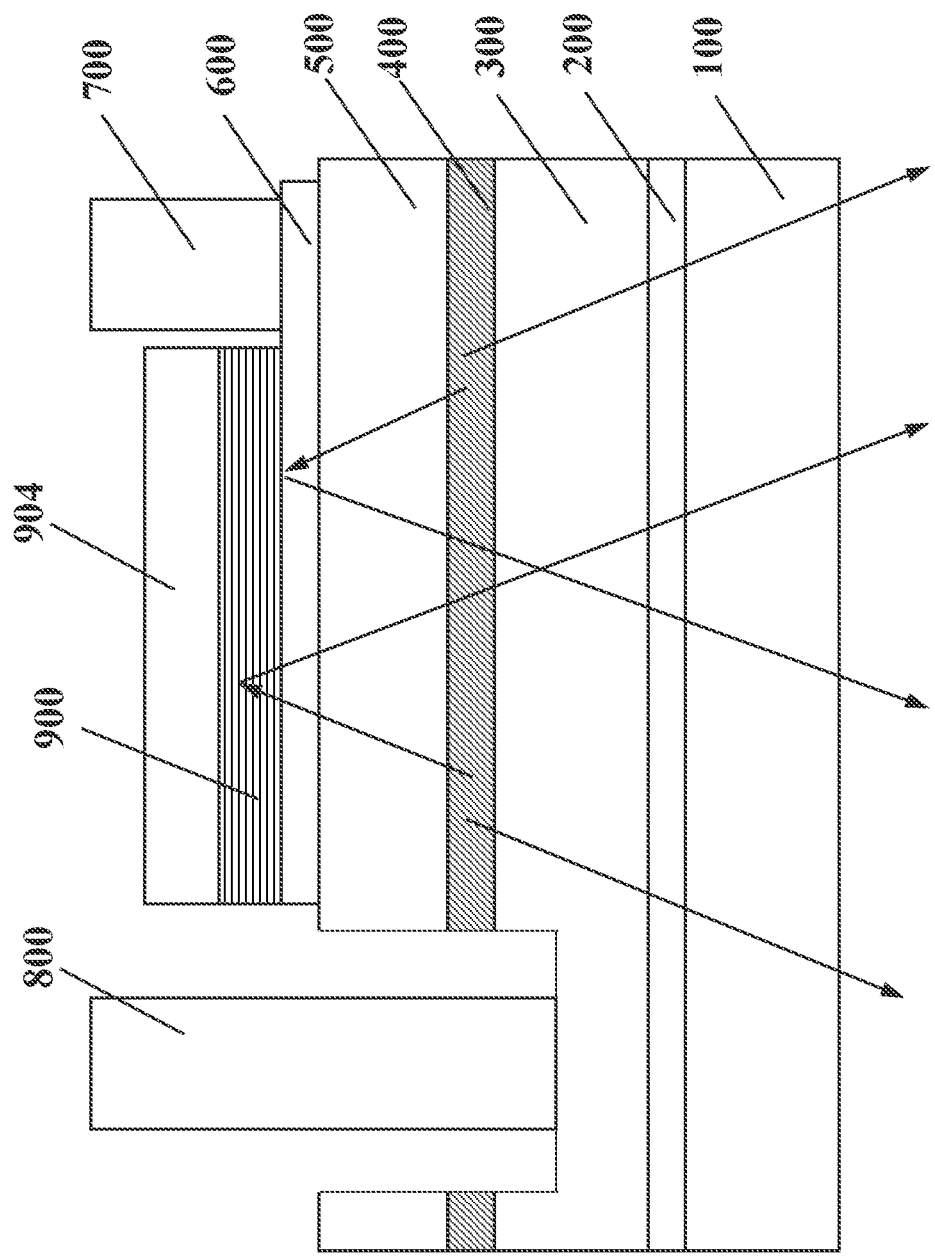
FIG. 1 is a structural diagram of a known light-emitting diode.

In the drawings, 100: Substrate; 200: semiconductor laminate; 201: First conductive type semiconductor layer; 202: Active layer; 203: Second conductive type semiconductor layer; 300: First insulating layer; 400A: First electrode; 400B: Second electrode; 401: First sub-electrode; 402: Second sub-electrode; 500: Second insulating layer; 601: Third electrode; 602: Fourth electrode; 700: Third insulating layer; 801: Fifth electrode; 802: Sixth electrode; 900: Electrode opening.

DETAILED DESCRIPTION

Various embodiments of the present disclosure will be described in detail with reference to the accompanying drawings and examples, to help understand and practice the disclosed embodiments, regarding how to solve technical problems using technical approaches for achieving the technical effects. It should be noted that the embodiments and their characteristics described in this disclosure may be combined with each other and such technical proposals are deemed to be within the scope of this disclosure without departing from the spirit of this invention.

Embodiment 1

Figure 2:
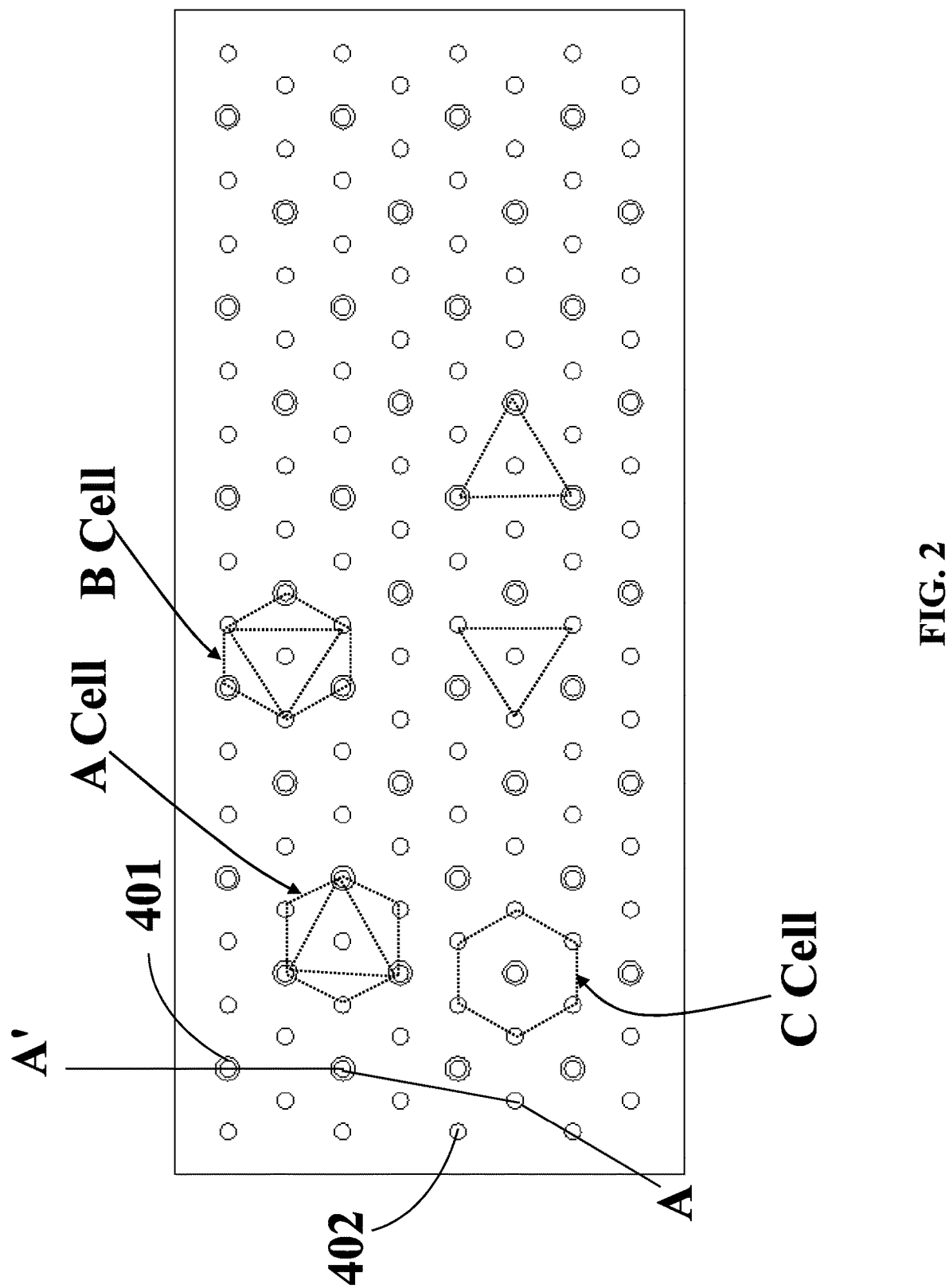
FIG. 2 is a top view of the light-emitting diode according to Embodiment 1 of the present disclosure.
Figure 3:
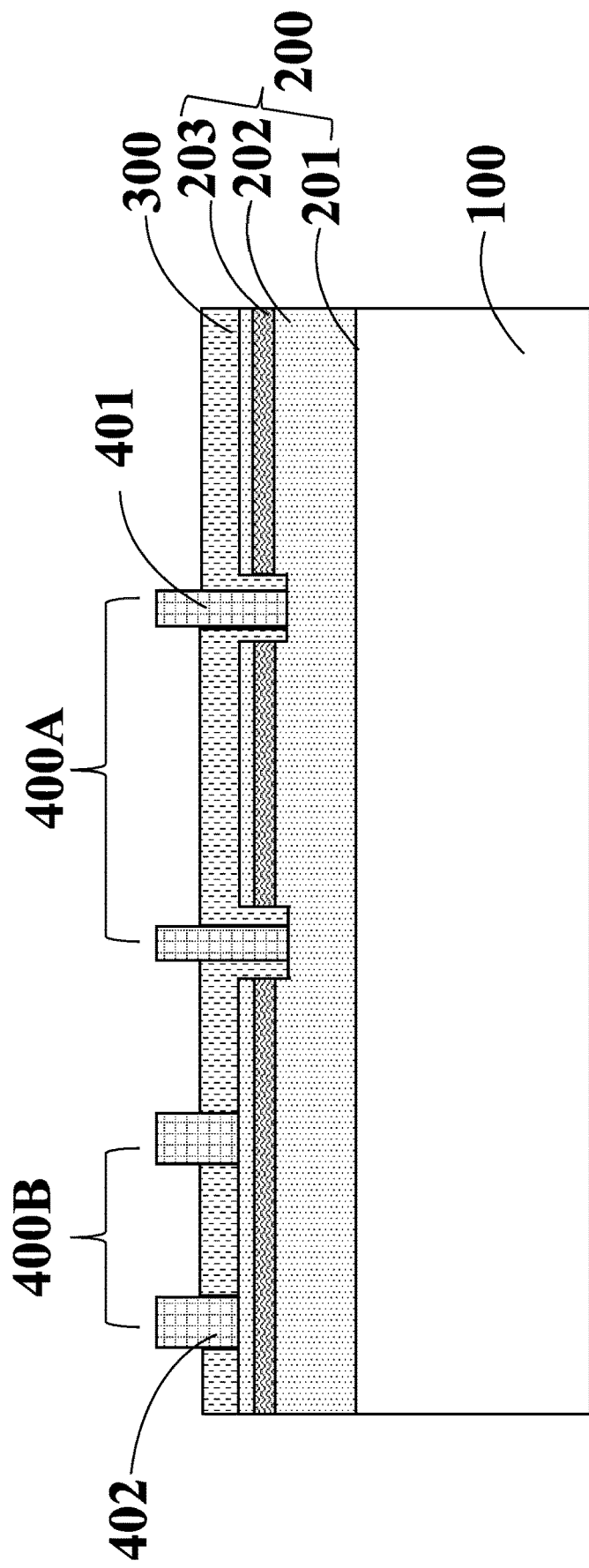
FIG. 3 is a sectional diagram along the A-A' line of FIG. 2.

FIG. 2 and FIG. 3 show a light-emitting diode, comprising substrate 100 and semiconductor laminate 200 on substrate 100, further comprising: first conductive type semiconductor layer 201; second conductive type semiconductor layer 203 disposed on first conductive type semiconductor layer 201; active layer 202 between first conductive type semiconductor layer 201 and second conductive type semiconductor layer 203; first electrode 400A and second electrode 400B, wherein first electrode 400A being electrically connected to first conductive type semiconductor layer 201, second electrode 400B being disposed on and electrically connected to second conductive type semiconductor layer 203, first electrode 400A including several first sub-electrodes 401, and second electrode 400B including several second sub-electrodes 402; insulating layer 300 being disposed beyond the areas of first electrode 400A and second electrode 400B on surface of the semiconductor laminate.

Specifically, substrate 100 can be, but without limitation to, any of the following: sapphire, aluminum nitride, gallium nitride, silicon and silicon carbide, having plain or patterned surface. In this embodiment, sapphire is In some embodiments used as substrate 100. The semiconductor laminate can be made of gallium nitride-based, gallium phosphide-based, gallium-nitrogen-phosphorus-based or zinc oxide-based material. In this embodiment, gallium nitride-based material is used. The epitaxial layer from the bottom to the top is composed of an n-type semiconductor layer, an active layer and a p-type semiconductor layer, wherein: the n-type semiconductor layer is an N—GaN layer, the active layer is an AlGaN MQW active layer, and the p-type semiconductor layer is a P—GaN layer. The structure of the semiconductor laminate according to this embodiment is not limited to the N—GaN layer-AlGaN MQW active layer-P—GaN layer structure, but can be any other epitaxial structure triggering light emitting. Insulating layer 300 can be made of $Mg_xN_y$, $Si_xN_y$, $Si_xO_y$, $Ti_xO_y$, $Zr_xO_y$, $Hf_xO_y$ or other materials (such as polyimide, Teflon, poly-p-xylylene or other polymers). In this embodiment, a combination of highly reflective $Ti_xO_y$ and poorly reflective $Si_xO_y$ is used as insulating layer 300. The highly and poorly reflective materials are alternatively arranged on the distributed Bragg reflector (DBR) to reflect lights from the active layer.

With reference to FIG. 2, the first electrode and the second electrode can be round, or otherwise square, hexagonal or of other regular polygon shape. In this embodiment, round electrodes are In some embodiments used. Each first sub-electrode or second sub-electrode is evenly and separately distributed; any two adjacent first sub-electrodes and/or second sub-electrodes have the same projection distance, which is the minimum distance between any two first sub-electrodes and/or second sub-electrodes. The distance between two first sub-electrodes ranges between 10~150 μm and In some embodiments between 50~150 μm; the distance between two second sub-electrodes ranges between 10~150 μm and In some embodiments between 50~150 μm. The first electrode and/or the second electrode include(s) six first sub-electrodes and/or second sub-electrodes constituting one minimal unit of close-packed hexagonal structure, in realization of the most close-packed arrangement of sub-electrodes. In A Cell, the close-packed hexagonal structure has one first sub-electrode as the center and includes three first sub-electrodes 401 and three second sub-electrodes 402; the first sub-electrodes and the second sub-electrodes are arranged in a staggered manner; the three first sub-electrodes constitute one minimal unit of equilateral triangle. In B Cell, the close-packed hexagonal structure includes three first sub-electrodes 401 and three second sub-electrodes 402; the first sub-electrodes and the second sub-electrodes are arranged in a staggered manner; the three first sub-electrodes constitute one minimal unit of equilateral triangle. In C Cell, the close-packed hexagonal structure has one first sub-electrode as the center and includes six second sub-electrodes.

It should be noted that since the first electrode and the second electrode are mainly used to disperse current and form ohmic contact with the semiconductor laminate, if the first electrode has better ohmic contact with the semiconductor laminate than the second electrode, then first sub-electrodes having better ohmic contact with the semiconductor laminate are In some embodiments selected; the number of first sub-electrodes is smaller than the number of the second sub-electrodes, and the proportion of the first sub-electrodes to the second sub-electrodes may range from 0.3~0.9.

In the structure of the light-emitting diode provided in this embodiment, the first electrodes and the second electrodes are evenly and separately distributed; any two adjacent first sub-electrodes and/or second sub-electrodes have the same projection distance; the first electrodes are separate and not interconnected; the first conductive type semiconductor layer has reduced platform etching area to enlarge the light emitting area; the second electrodes are separate and not interconnected, so that the interface between the light emitting area and the insulating layer (such as the DBR reflecting layer) is maximized and the luminance is enhanced; all sub-electrodes are distributed in an even array; any two adjacent first sub-electrodes and/or second sub-electrodes have the same projection distance, enabling the optimal distribution of current dispersion and reduction of the forward voltage fall (VF).

Embodiment 2

Figure 4:
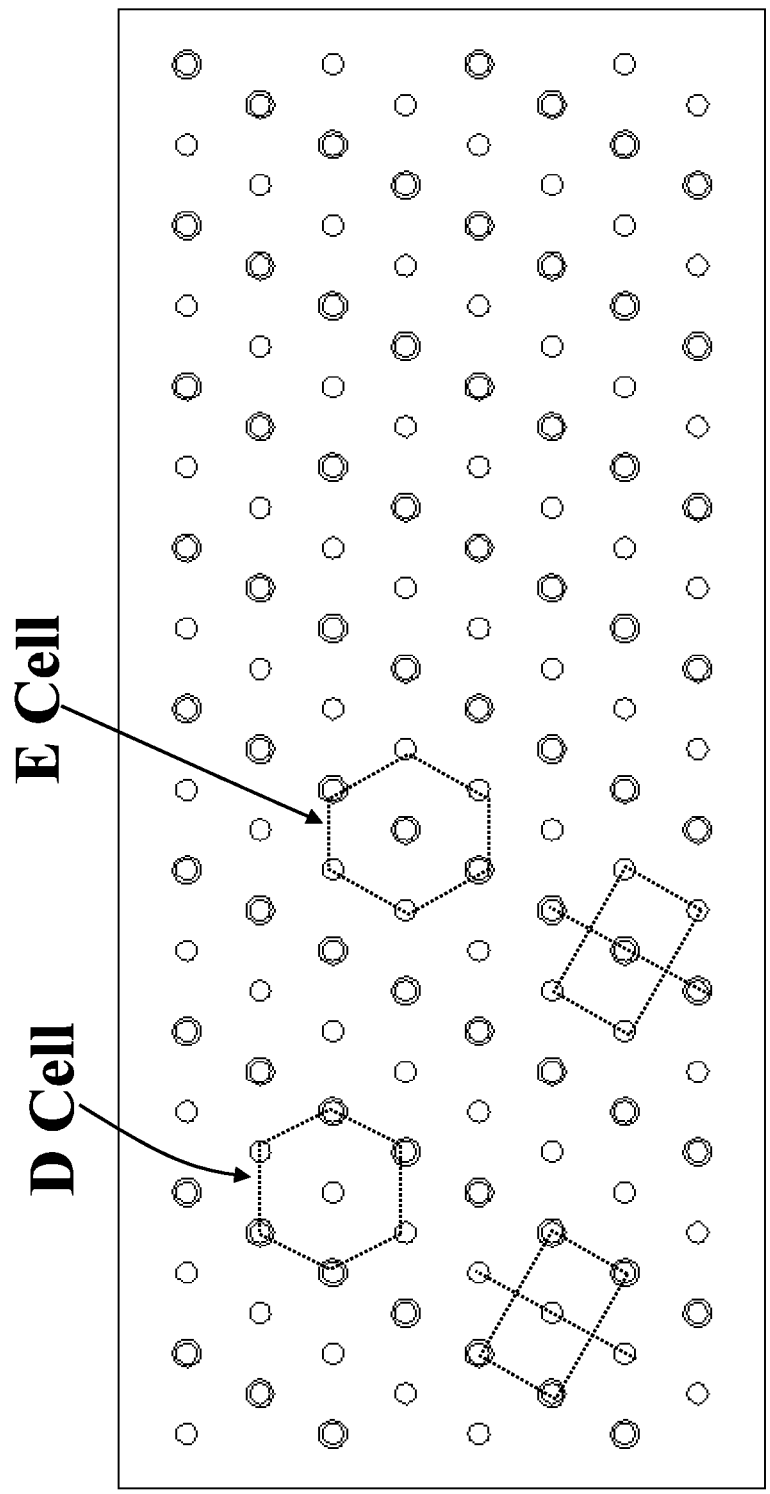
FIG. 4 is a top view of the light-emitting diode according to Embodiment 2.

FIG. 4 shows a structural diagram of a second light-emitting diode. What this embodiment is identical to EMBODIMENT 1 is that the first electrode and the second electrode in the structure of the light-emitting diode provided in this embodiment are composed of six first sub-electrodes and/or second sub-electrodes constituting one minimal unit of close-packed hexagonal structure. What this embodiment differs from EMBODIMENT 1 is that the structure of the light emitting structure provided in this embodiment includes an equal number of first sub-electrodes and second sub-electrodes. In D Cell, the close-packed hexagonal structure has one second sub-electrode as the center and includes four first sub-electrodes and two second sub-electrodes. The four first sub-electrodes form a rectangular structure, while the two second sub-electrodes are on the same line with the one second sub-electrode located at the center of the close-packed hexagonal structure. In E Cell, the close-packed hexagonal structure has one first sub-electrode as the center and includes two first sub-electrodes and four second sub-electrodes. The four second sub-electrodes form a rectangular structure, while the two first sub-electrodes are on the same line with the one first sub-electrode located at the center of the close-packed hexagonal structure.

Embodiment 3

Figure 5:
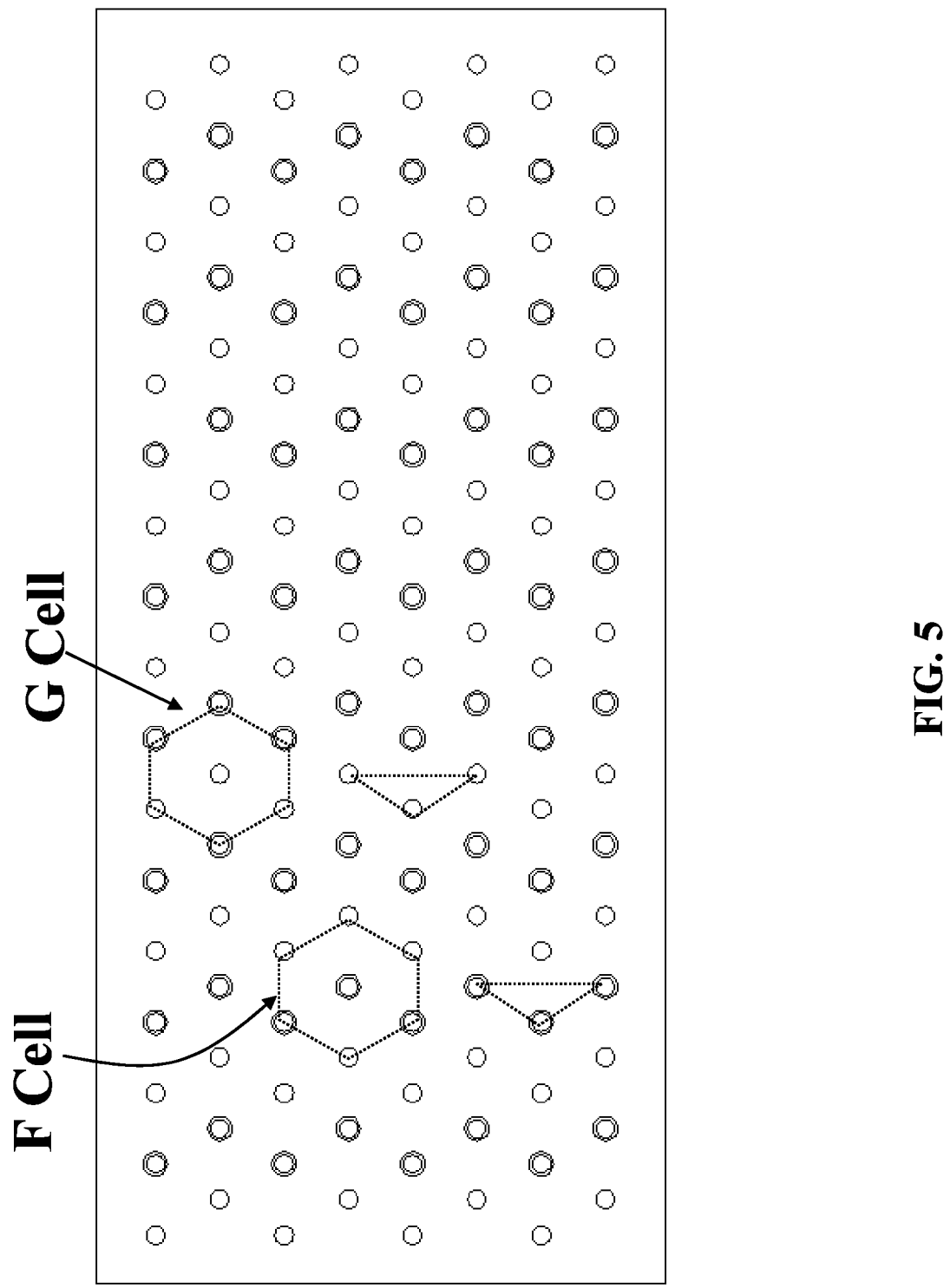
FIG. 5 is a top view of the light-emitting diode according to Embodiment 3.

FIG. 5 shows a structural diagram of a third light-emitting diode. What this embodiment is identical to EMBODIMENT 2 is that in that the close-packed hexagonal structure in the structure of the light-emitting diode provided in this embodiment includes two first sub-electrodes and four second sub-electrodes or four first sub-electrodes and two second sub-electrodes. What this embodiment differs from EMBODIMENT 2 is that the structure of the light emitting structure provided in this embodiment includes fewer first sub-electrodes than second sub-electrodes; specifically, the proportion of first sub-electrodes to second sub-electrodes is 8:9, ranging between 0.3~0.9. In F Cell, the close-packed hexagonal structure has one first sub-electrode as the center and includes two first sub-electrodes and four second sub-electrodes. The two first sub-electrodes form an isosceles triangle with the one first sub-electrode located at the center of the close-packed hexagonal structure. In G Cell, the close-packed hexagonal structure has one second sub-electrode as the center and includes four first sub-electrodes and two second sub-electrodes. The two second sub-electrodes form an isosceles with the one first sub-electrode located at the center of the close-packed hexagonal structure.

Embodiment 4

Figure 6:
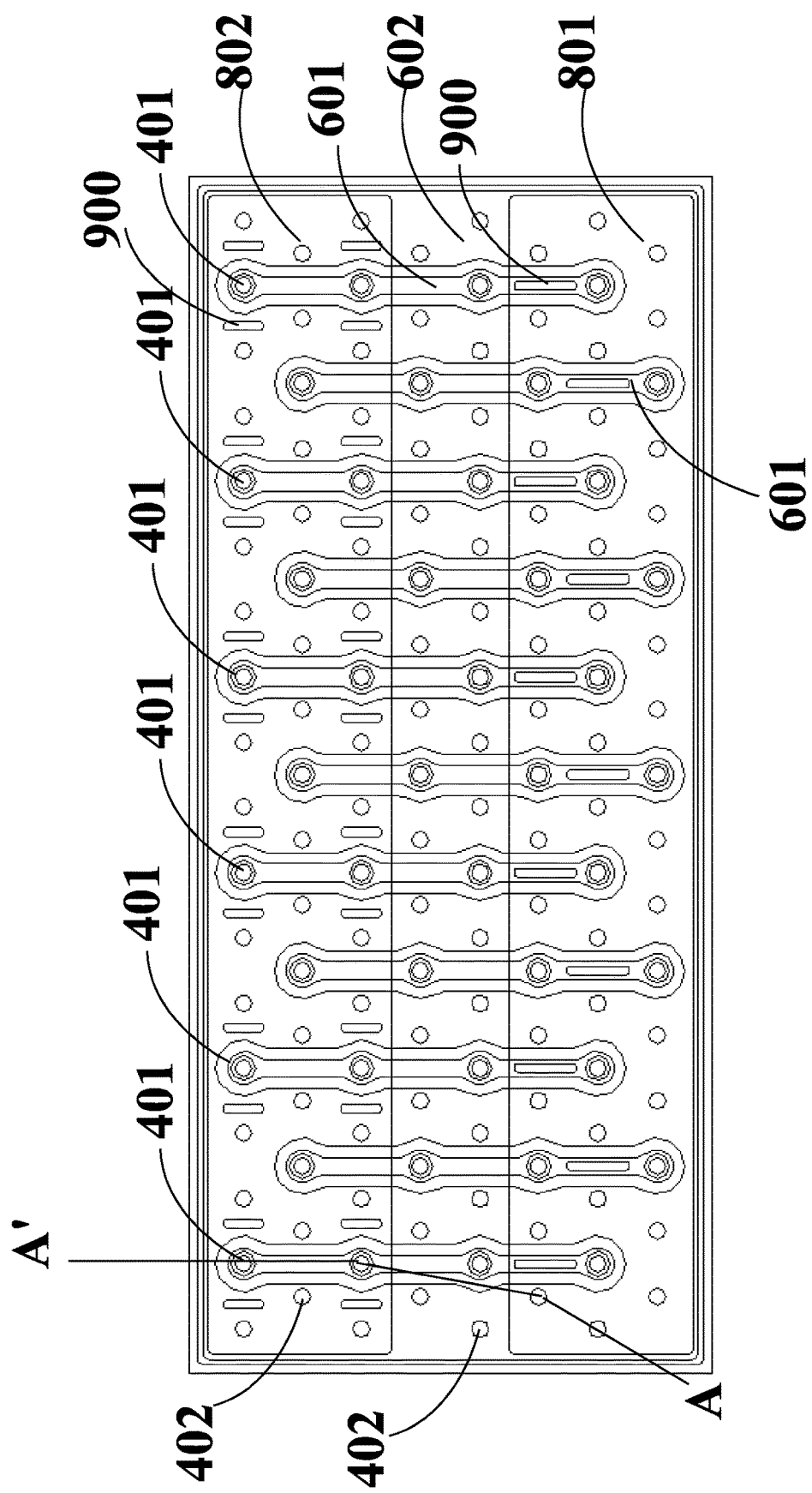
FIG. 6 is a top view of the light-emitting diode according to Embodiment 4.
Figure 7:
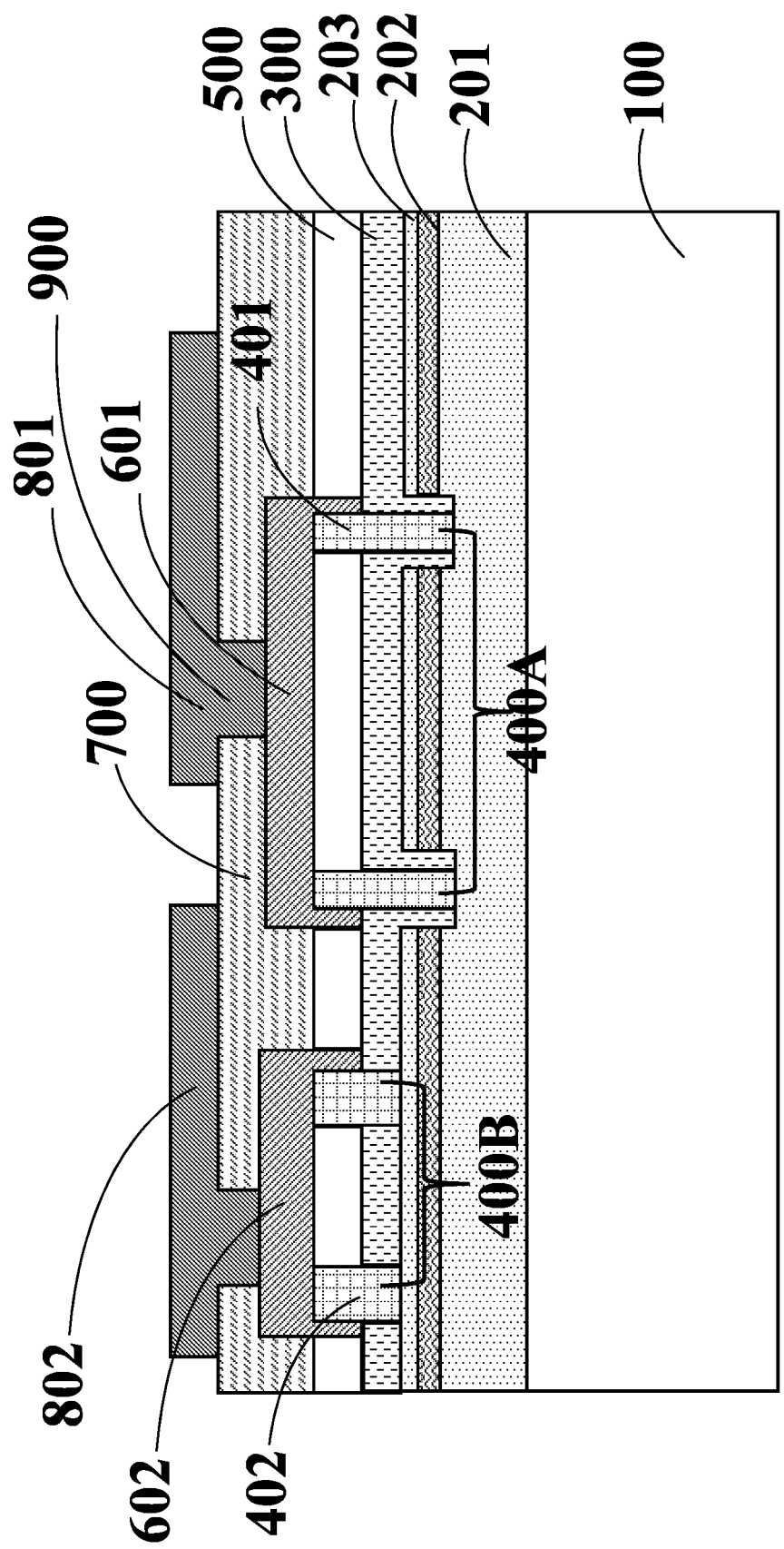
FIG. 7 is a sectional diagram along the A-A' line of FIG. 6.

FIG. 6 and FIG. 7 show a light-emitting diode, comprising substrate 100 and semiconductor laminate 200 formed on substrate 100, further comprising: first conductive type semiconductor layer 201; second conductive type semiconductor layer 203 on first conductive type semiconductor layer 201; active layer 202 between first conductive type semiconductor layer 201 and second conductive type semiconductor layer 203; first electrode 400A and second electrode 400B—first electrode 400A being electrically connected to first semiconductor 201, second electrode 400B disposed on and electrically connected second conductive type semiconductor layer 203, first electrode 400A includes several first sub-electrodes 401, and second electrode 400B includes several second sub-electrodes 402; first insulating layer 300 disposed beyond the areas of first electrode 400A and second electrode 400B on surface of the semiconductor laminate; third electrode 601 including several third sub-electrodes, lying on and wrapping first electrode 400A for connecting to several first sub-electrodes 401; fourth electrode 602 including several fourth electrodes, lying on and wrapping second electrode 400B for connecting several second sub-electrodes 402; second insulating layer 500, lying on the first insulating layer 300 for electric insulation of third electrode 601 and fourth electrode 602; third insulating layer 700, lying on the third electrode, the fourth electrode and the second insulating layer, with the electrode opening exposed; fifth electrode 801 and sixth electrode 802 filling electrode openings and lying on partial surface of third insulating layer 700—the fifth electrode being used for connecting to several third sub-electrodes and the sixth electrode being used for connecting several fourth sub-electrodes.

Specifically, substrate 100 can be, but without limitation to, any of the following: sapphire, Aluminum nitride, gallium nitride, silicon and silicon carbide, having plain or patterned surface. In this embodiment, sapphire is In some embodiments used as substrate 100. The semiconductor laminate can be made of gallium nitride-based, gallium phosphide-based, gallium-nitrogen-phosphorus-based or zinc oxide-based material. In this embodiment, gallium nitride-based material is used. The epitaxial layer from the bottom to the top is composed of an n-type semiconductor layer, an active layer and a p-type semiconductor layer, wherein: the n-type semiconductor layer is an N—GaN layer, the active layer is an AlGaN MQW active layer, and the p-type semiconductor layer is a P—GaN layer. The structure of the semiconductor laminate according to this embodiment is not limited to the N—GaN layer-AlGaN MQW active layer-P—GaN layer structure, but can be any other epitaxial structure triggering light emitting. First insulating layer 300, second insulating layer 500 and third insulating layer 700 can be made of $Mg_xN_y$, $Si_xN_y$, $Si_xO_y$, $Ti_xO_y$, $Zr_xO_y$, $Hf_xO_y$ or other materials (such as polyimide, Teflon, poly-p-xylylene or other polymers). In this embodiment, a combination of highly reflective $Ti_xO_y$ and poorly reflective $Si_xO_y$ is used as insulating layer. The highly and poorly reflective materials are alternatively arranged on the distributed Bragg reflector (DBR) to reflect lights from the active layer.

Figure 8:
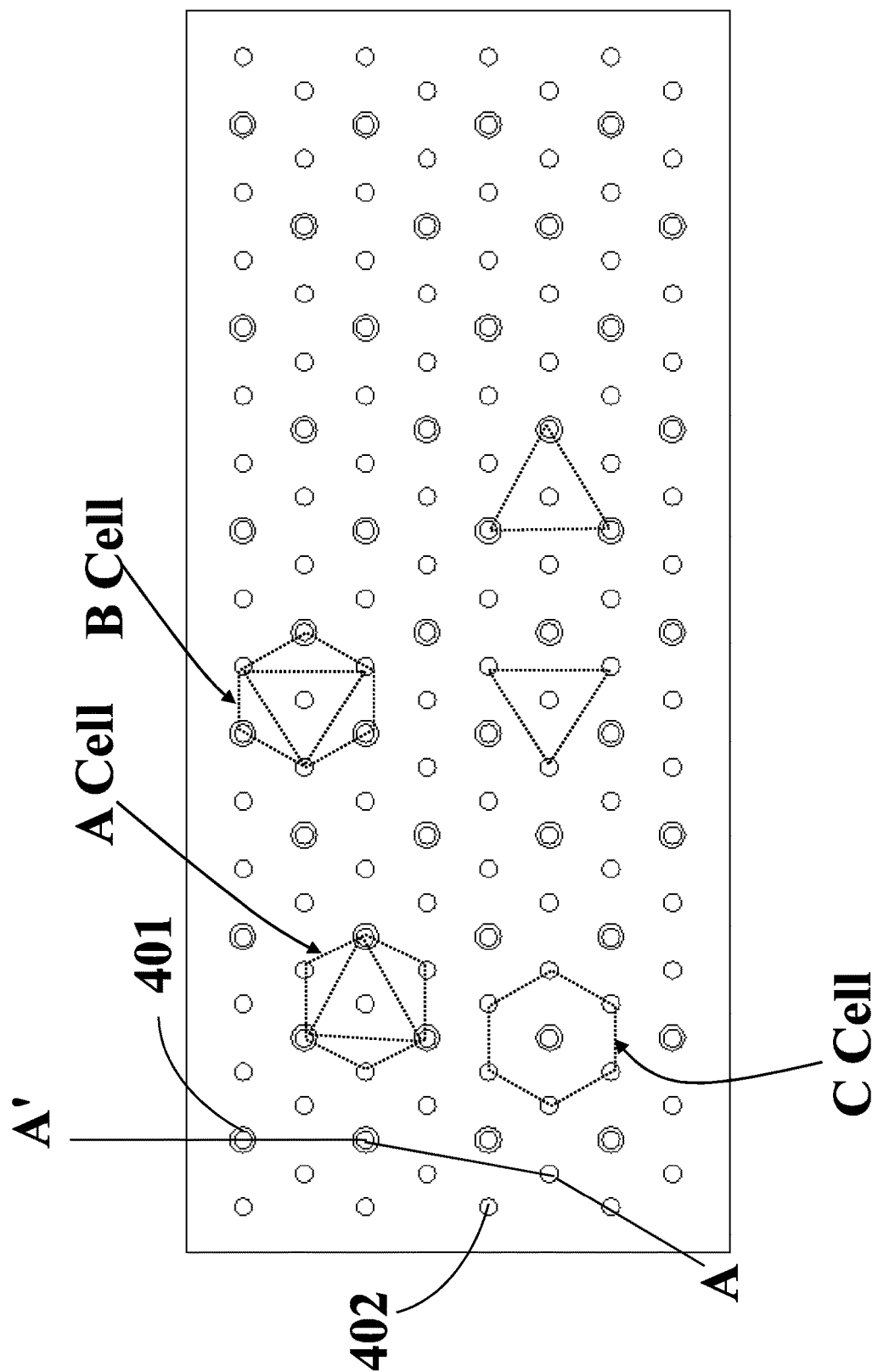
FIG. 8 is a top view of the light-emitting diode according to Embodiment 4 (the first electrode and the second electrode are shown, while the third electrode, the fourth electrode, the fifth electrode and the sixth electrode are not shown).
Figure 9:
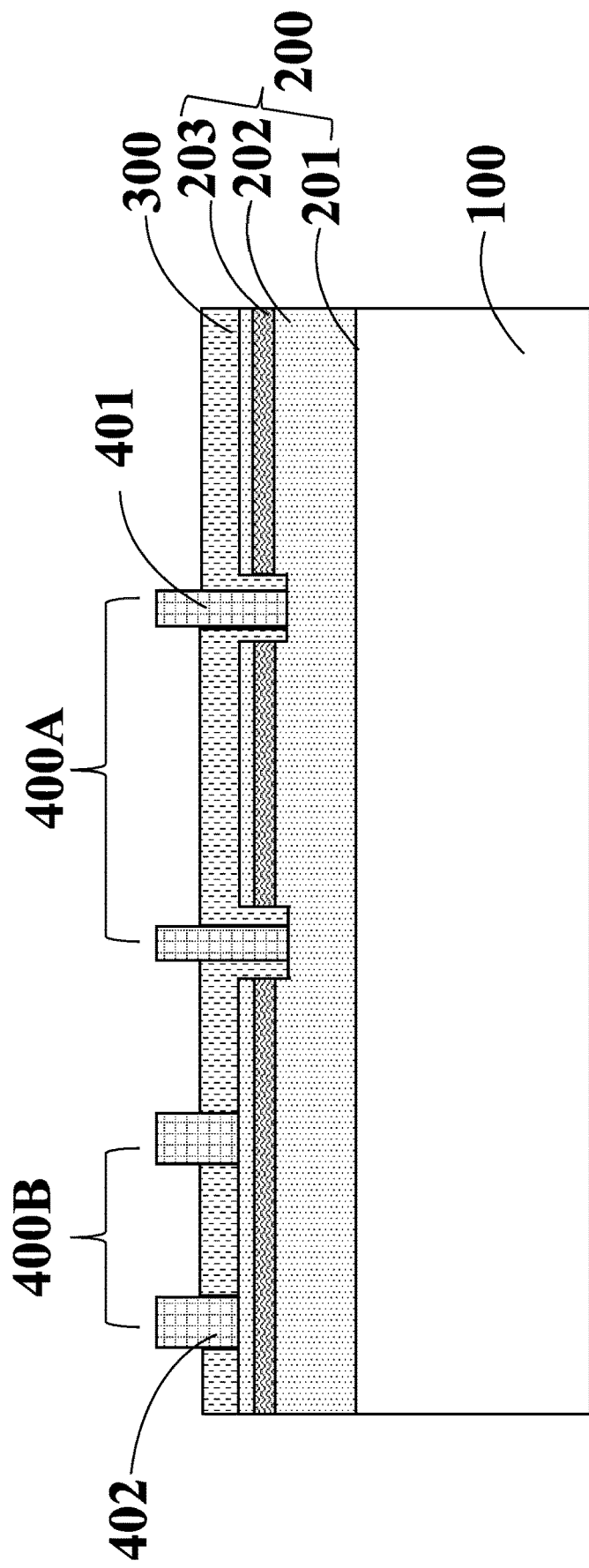
FIG. 9 is a sectional diagram along the A-A' line of FIG. 8.

With reference to FIG. 8 and FIG. 9, the first electrode and the second electrode can be round, or otherwise square, hexagonal or of other regular polygon shape. In this embodiment, round electrodes are In some embodiments used. Each first sub-electrode 401 or second sub-electrode 402 is evenly and separately distributed; any two adjacent first sub-electrodes and/or second sub-electrodes have the same projection distance, which is the minimum distance between any two first sub-electrodes and/or second sub-electrodes. The distance between two first sub-electrodes ranges between 10~150 μm and In some embodiments between 50~150 μm; the distance between two second sub-electrodes ranges between 10~150 μm and In some embodiments between 50~150 μm. The first electrode and/or the second electrode include(s) six first sub-electrodes and/or second sub-electrodes constituting one minimal unit of close-packed hexagonal structure, in realization of the most close-packed arrangement of sub-electrodes. In A Cell, the close-packed hexagonal structure has one first sub-electrode as the center and includes three first sub-electrodes 401 and three second sub-electrodes 402; the first sub-electrodes and the second sub-electrodes are arranged in a staggered manner; the three first sub-electrodes constitute one minimal unit of equilateral triangle. In B Cell, the close-packed hexagonal structure includes three first sub-electrodes 401 and three second sub-electrodes 402; the first sub-electrodes and the second sub-electrodes are arranged in a staggered manner; the three second sub-electrodes constitute one minimal unit of equilateral triangle. In C Cell, the close-packed hexagonal structure has one first sub-electrode as the center and includes six second sub-electrodes.

With further reference to FIG. 6 and FIG. 7, third electrode 601 is composed of eleven third sub-electrodes of the same shape but arranged in a staggered manner for connection to first sub-electrodes 401A; fourth electrode 602 is composed of four sub-electrodes for connection to second sub-electrodes 401B; third sub-electrodes can be of straight or curved strip pattern, and straight strip pattern is In some embodiments selected in this embodiment; fourth sub-electrodes have hollow pattern. According to FIG. 3, adjacent third sub-electrodes in this embodiment have the same spacing; third sub-electrodes are located at hollow parts of fourth sub-electrodes and have complementary pattern to the fourth sub-electrodes; the proportion of third sub-electrodes to fourth sub-electrodes is 11:1. Through proper proportioning of the third sub-electrodes to the fourth sub-electrodes, the uniformity of current injection distribution can be effectively regulated, so as to enhance the light emitting uniformity and efficiency of the light-emitting diode. Fifth electrode 801 and sixth electrode 802 have the same shape and are arranged in a symmetrical manner for convenience of eutectic soldering encapsulation or other process.

It should be noted that since the first electrode and the second electrode mainly function to disperse current and form ohmic contact with the semiconductor laminate, if the first electrode has better ohmic contact with the semiconductor laminate than the second electrode, then first sub-electrodes having better ohmic contact with the semiconductor laminate but fewer than second sub-electrodes are In some embodiments selected; the proportion of the first sub-electrodes to the second sub-electrodes may range from 0.3~0.9. The third electrode and the fourth electrode mainly function to realize electrical connection of sub-electrodes in the N and P electrode areas. The fifth electrode and the sixth electrode mainly function to set a reflective metal layer, with highly reflective metal such as Al and Ag, between the first insulating layer and the second insulating layer, so as to enhance the reflection of light from the active layer and improve the light extraction efficiency.

To sum up, in the structure of the light-emitting diode provided in this embodiment, the first electrode and the second electrode are evenly and separately distributed; any two adjacent first sub-electrodes and/or second sub-electrodes have the same projection distance; the first electrodes are separate and not interconnected; the first conductive type semiconductor layer has reduced platform etching area to increase the light emitting area; the second electrodes are separate and not interconnected, so that the interface between the light emitting area and the insulating layer (such as the DBR reflecting layer) is maximized and the luminance is enhanced; all sub-electrodes are distributed in an even array; any two adjacent first sub-electrodes and/or second sub-electrodes have the same projection distance to achieve the optimal distribution of current dispersion and reduce the forward voltage fall (VF). Through proper proportioning of the third sub-electrodes to the fourth sub-electrodes, the uniformity of current injection distribution can be effectively regulated, so as to enhance the light emitting uniformity and efficiency of the light-emitting diode.

Embodiment 5

Figure 10:
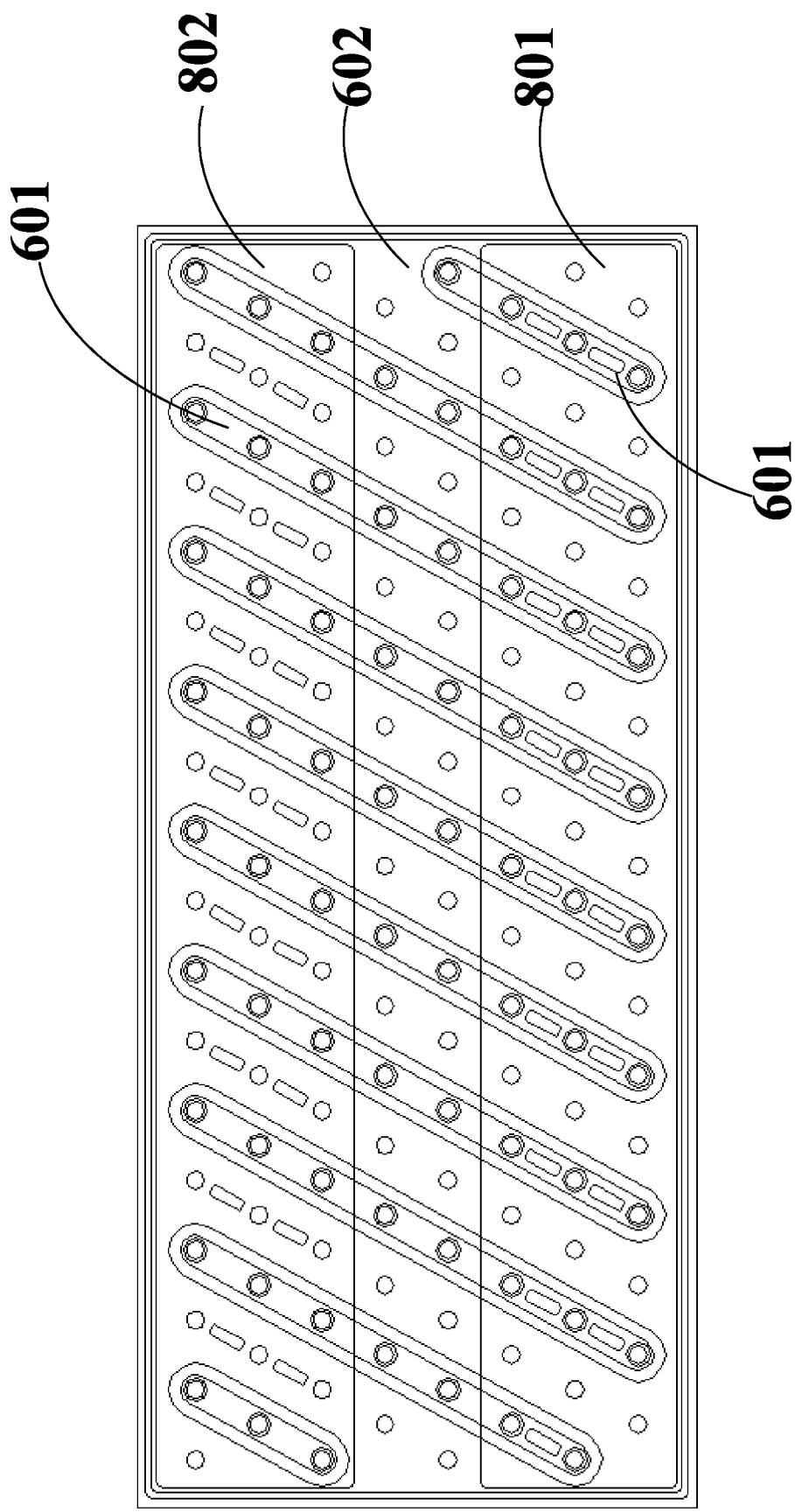
FIG. 10 is a top view of the light-emitting diode according to Embodiment 5 of the present disclosure.

FIG. 10 shows a structural diagram of a fifth light-emitting diode. What this embodiment is identical to EMBODIMENT 4 is that in the structure of the light-emitting diode provided in this embodiment, the fourth sub-electrodes also have hollow pattern. What this embodiment differs from EMOBODIMENT 4 is that in the structure of the light-emitting diode provided in this embodiment, third electrode 601 is composed of ten third sub-electrodes, wherein seven larger third sub-electrodes have the same shape, the two smaller third sub-electrodes have the same shape, and the one third sub-electrode has the medium size. Additionally, adjacent third sub-electrodes have five to eight second sub-electrodes placed in between; the five to eight sub-electrodes placed in between have the same or similar pattern with neighboring third sub-electrodes.

Embodiment 6

Figure 11:
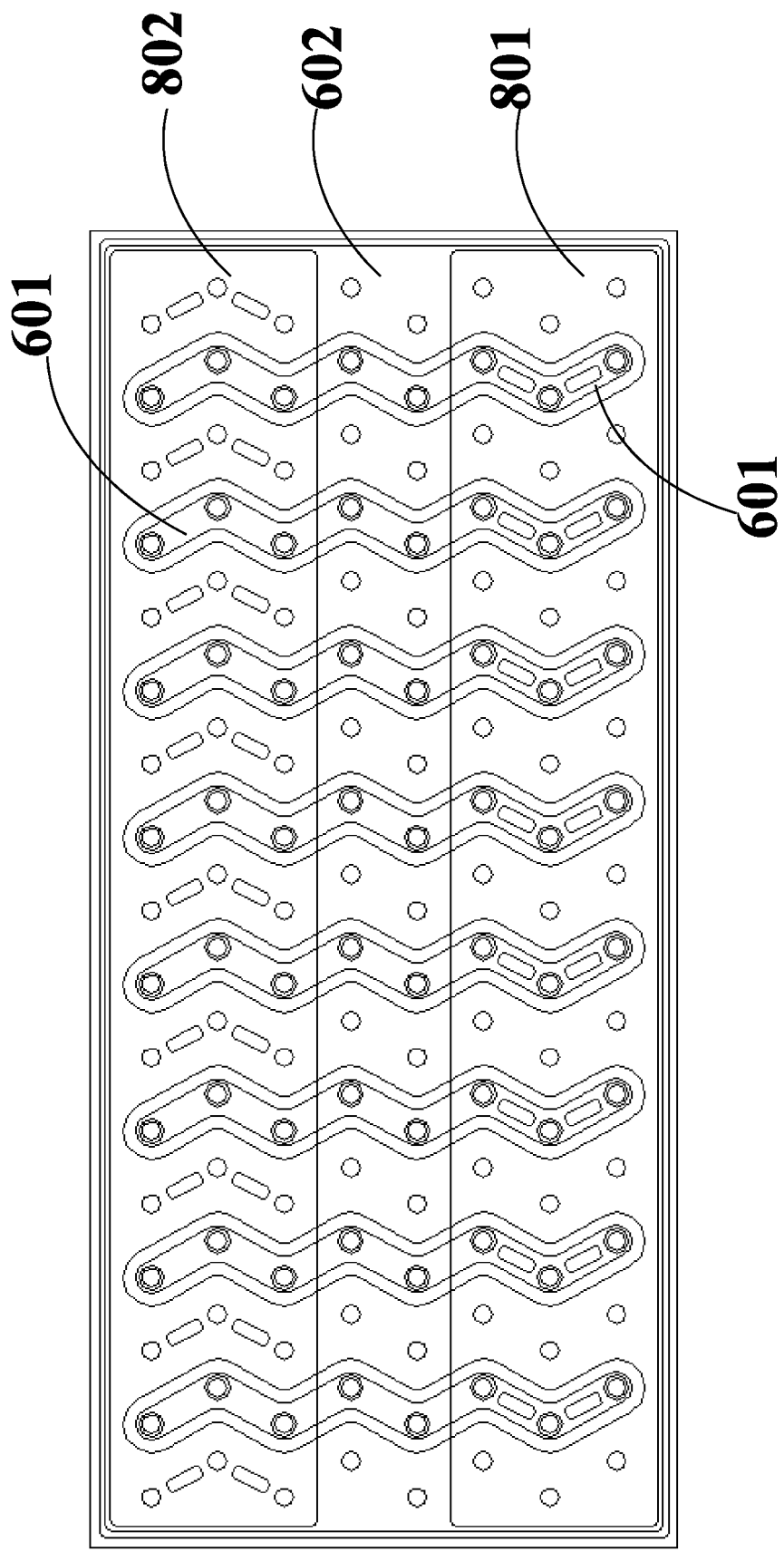
FIG. 11 is a top view of the light-emitting diode according to Embodiment 6 of the present disclosure.

FIG. 11 shows a structural diagram of a sixth light-emitting diode. What this embodiment is identical to EMBODIMENT 4 is that in the structure of the light-emitting diode provided in this embodiment, the fourth sub-electrodes also have hollow pattern. What this embodiment differs from EMOBODIMENT 4 is that in the structure of the light-emitting diode provided in this embodiment, third electrode 601 is composed of eight third sub-electrodes and has curved strip pattern. The curved strip pattern can be S-shaped, Z-shaped or otherwise; the S-shaped pattern is preferentially selected in this embodiment. Besides, adjacent third sub-electrodes have eight second sub-electrodes placed in between; the eight sub-electrodes placed in between have the same pattern with neighboring third sub-electrodes.

Embodiment 7

Figure 12:
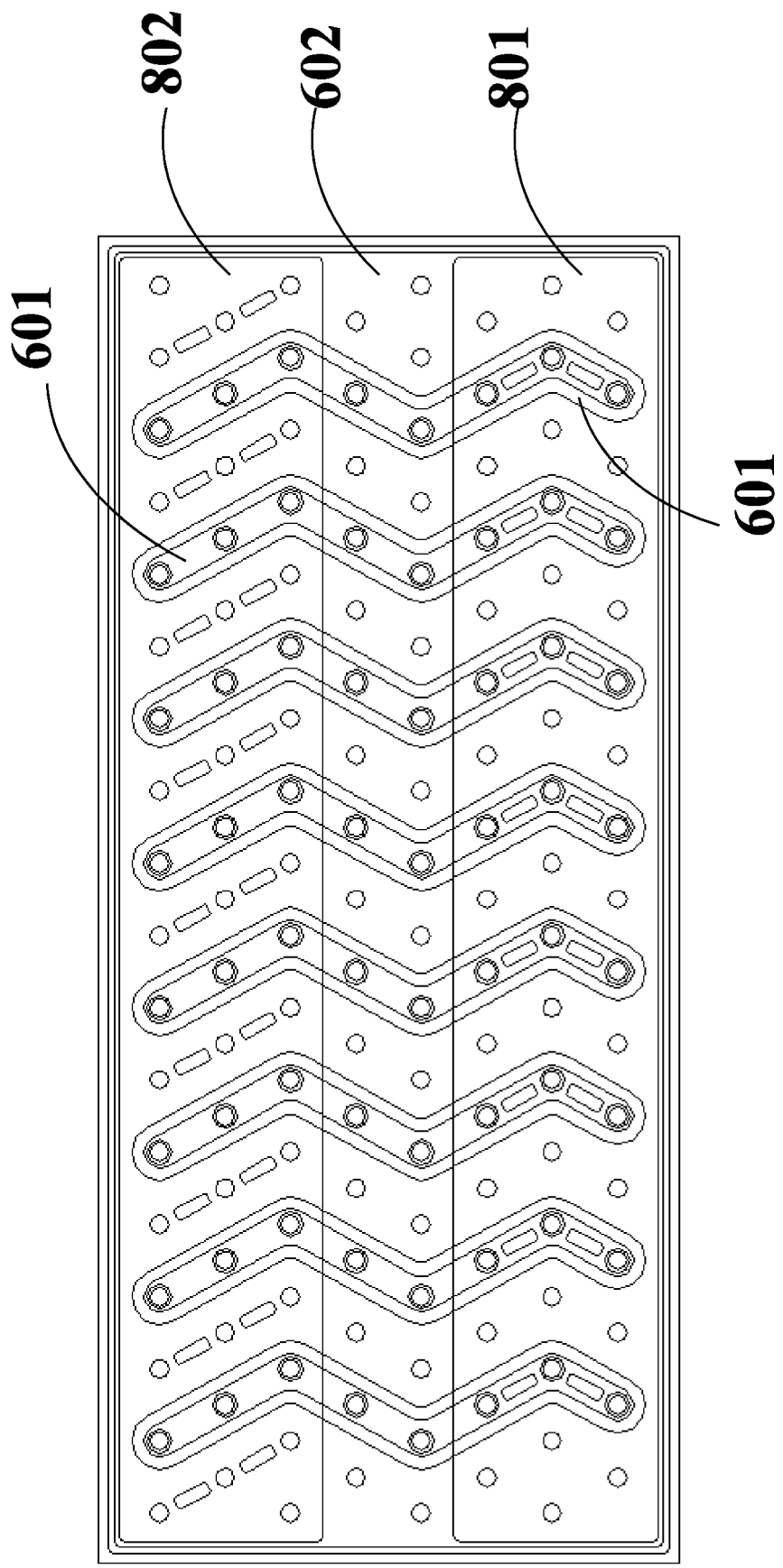
FIG. 12 is a top view of the light-emitting diode according to Embodiment 7 of the present disclosure.

FIG. 12 shows a structural diagram of a seventh light-emitting diode. What this embodiment is identical to EMBODIMENT 6 is that in the structure of the light-emitting diode provided in this embodiment, the third sub-electrodes also have curved strip pattern. What this embodiment differs from EMBODIMENT 6 in that in the structural of the light-emitting diode provided in this embodiment, the third sub-electrodes have Z-shaped pattern.

As shown, the first electrode includes a plurality of first sub-electrodes corresponding respectively to n electrically-conductive through-holes, wherein the plurality of first sub-electrodes are divided into one or more groups, and any two adjacent first sub-electrodes in the same group have a same projection distance. The second electrode disposed over and electrically coupled to the second semiconductor layer. The third electrode is coupled to the plurality of first sub-electrodes and includes one or more third sub-electrodes, wherein one of the third sub-electrodes corresponds to one of said one or more groups of the first sub-electrodes and connects first sub-electrodes in the group.

In some embodiments, a light-emitting system can be provided, including a plurality of the light-emitting diodes. The light-emitting system can be used in lighting, signage, display, etc.

Embodiment 8

Figure 13:
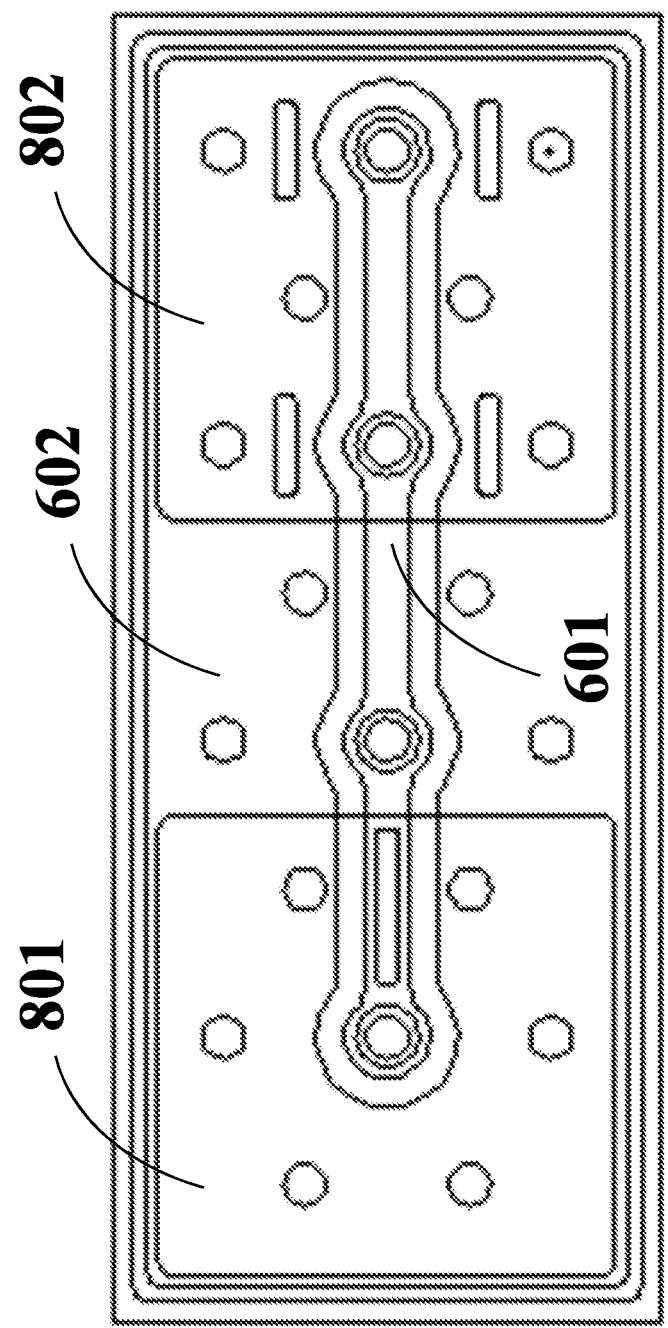
FIG. 13 is a top view of the light-emitting diode according to Embodiment 8 of the present disclosure.

FIG. 13 shows a structural diagram of an eighth embodiment of a light-emitting diode. This embodiment is different from EMBODIMENT 6 in that in the structure of the light-emitting diode provided in this embodiment, the proportion of third sub-electrodes to fourth sub-electrodes is 2:1; based on the chip size, shape, power and other parameters of a light-emitting diode, the proportion of third sub-electrodes and fourth sub-electrodes can be regulated, for example, to above 4:1 or above 10:1, so as to achieve general light emitting uniformity of the light-emitting diode.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
a semiconductor epitaxial structure including a first semiconductor layer, a second semiconductor layer disposed over the first semiconductor layer, an active layer between the first and second semiconductor layers;
a first electrode electrically coupled to the first semiconductor layer and including a plurality of first sub-electrodes, wherein the plurality of first sub-electrodes are divided into one or more groups, and any two adjacent first sub-electrodes in the same group have a same projection distance;
a second electrode disposed over and electrically coupled to the second semiconductor layer;
a third electrode coupled to the plurality of first sub-electrodes and including one or more third sub-electrodes, wherein one of the third sub-electrodes corresponds to one of said one or more groups of the first sub-electrodes and connects first sub-electrodes in the group; and
a fourth electrode coupled to the second electrode.

2. The light-emitting diode of claim 1, wherein the plurality of first sub-electrodes are divided into a plurality of groups, and each group of the first sub-electrodes has a same arrangement pattern.

3. The light-emitting diode of claim 1, wherein the plurality of first sub-electrodes are divided into a plurality of groups, and any two adjacent groups have a same distance therebetween.

4. The light-emitting diode of claim 1, wherein the second electrode includes a plurality of second sub-electrodes, and any two adjacent first sub-electrodes and/or second sub-electrodes have a same projection distance.

5. The light-emitting diode of claim 4, wherein:
the first electrode and/or second electrode include(s) six sub-electrodes forming a minimal unit of closely-packed hexagonal structure; and
the six sub-electrodes are composed of one or more of the first sub-electrodes, the second sub-electrodes, or a combination of the first sub-electrodes and the second sub-electrodes.

6. The light-emitting diode of claim 5, wherein the first sub-electrodes and second sub-electrodes are arranged in a staggered manner.

7. The light-emitting diode of claim 6, wherein:
three first sub-electrodes constitute one minimal unit of equilateral triangle; and
three second sub-electrodes constitute one minimal unit of equilateral triangle.

8. The light-emitting diode of claim 4, wherein a number of the first sub-electrodes is smaller than or equal to a number of second sub-electrodes.

9. The light-emitting diode of claim 4, wherein a ratio of the first sub-electrodes to the second sub-electrodes ranges from 0.3-0.9.

10. The light-emitting diode of claim 4, wherein:
a distance between two adjacent first sub-electrodes is 10-150 µm; and
a distance between two adjacent second sub-electrodes is 10-150 µm.

11. A light-emitting system, comprising a plurality of the light-emitting diodes of claim 1, wherein the second electrode each comprises a plurality of second sub-electrodes, and the fourth electrode is coupled to the plurality of second sub-electrodes and includes a plurality of fourth sub-electrodes.

12. The light-emitting system of claim 11, wherein a ratio between the third sub-electrodes to the fourth sub-electrodes is greater than or equal to 2:1.

13. The light-emitting system of claim 11, wherein the third sub-electrodes have straight or curved strip pattern.

14. The light-emitting system of claim 13, wherein the curved strip pattern includes an S-shaped pattern or a Z-shaped pattern.

15. The light-emitting system of claim 11, wherein the third sub-electrodes have same or different shapes.

16. The light-emitting system of claim 11, wherein adjacent third sub-electrodes have one or more second sub-electrodes placed therebetween.

17. The light-emitting system of claim 16, wherein the one or more second sub-electrodes placed between have the same or similar patterns with neighboring third sub-electrodes.

18. The light-emitting system of claim 11, wherein the fourth sub-electrodes have a hollow pattern.

19. The light-emitting system of claim 11, further comprising a fifth electrode and a sixth electrode, wherein the fifth electrode is coupled to the plurality of third sub-electrodes, and the sixth electrode is coupled to the plurality of fourth sub-electrodes.

20. The light-emitting system of claim 19, wherein the fifth electrode and sixth electrode have the same shape and are arranged symmetrically.

* * * * *